Figure 5:
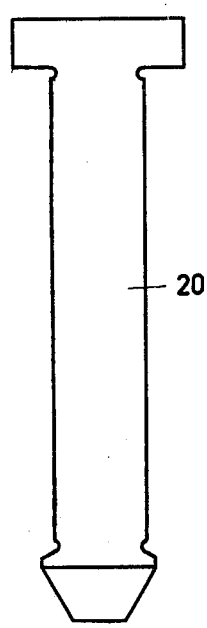

United States Patent [19]

Iding

[11] 4,286,122
[45] Aug. 25, 1981

[54] ACOUSTIC ELECTRICAL CONVERSION DEVICE WITH AT LEAST ONE CAPACITOR ELECTRET ELEMENT CONNECTED TO AN ELECTRONIC CIRCUIT

[75] Inventor: Wilhelmus H. Iding, Breda, Netherlands

[73] Assignee: U.S. Philips Corporation, New York, N.Y.

[21] Appl. No.: 20,152

[22] Filed: Mar. 13, 1979

[30] Foreign Application Priority Data

Mar. 13, 1978 [NL] Netherlands ................. 7802688

[51] Int. Cl.³ .................. H04R 19/00; H04R 21/02
[52] U.S. Cl. .................. 179/111 E; 179/132
[58] Field of Search .......... 179/1 A, 111 E, 115.5 PS, 179/116, 131, 132, 139, 181 R, 181 W; 307/400; 181/144, 145, 163, 164, 173

[56] References Cited

U.S. PATENT DOCUMENTS

| | | | |
|---|---|---|---|
| 3,300,585 | 1/1967 | Reedyk et al. | 179/1 A |
| 3,347,335 | 10/1967 | Watters et al. | 179/181 W |
| 3,624,315 | 11/1971 | Broce et al. | 179/1 A X |
| 3,669,214 | 6/1972 | Matsuura et al. | 181/164 |
| 3,702,464 | 11/1972 | Castrucci | 340/173 SP |
| 3,806,274 | 7/1975 | Fraim et al. | 307/400 X |
| 3,821,492 | 6/1974 | Tamura et al. | 179/181 R X |
| 3,851,183 | 11/1974 | Lewiner et al. | 179/111 E X |
| 3,894,243 | 7/1975 | Edelman et al. | 307/400 |
| 3,995,124 | 11/1976 | Gabr | 179/139 |
| 4,034,332 | 7/1977 | Alais | 179/111 E X |
| 4,063,050 | 12/1977 | Carlson et al. | 179/111 E |

Primary Examiner—Bernard Konick
Assistant Examiner—Aristotelis M. Psitos
Attorney, Agent, or Firm—William J. Streeter; Bernard Franzblau

[57] ABSTRACT

A device for the conversion of acoustic vibrations into electrical waves and vice versa, comprising at least one capacitor electret element which is connected to an electronic circuit which comprises an impedance transformer. The electret element includes at least one foil of a dielectric polymer material with at least one electrode arranged thereon with a part of the foil extending beyond the electret element. The electronic circuit is in the form of an integrated semiconductor device disposed on this part of the foil with the electrode electrically connected to one terminal of the semiconductor device via a conductor arranged on the foil. The foil may comprise a special pattern of conductors and electrodes, to which the integrated semiconductor device is connected. The assembly can be folded to provide a plurality of transducers in the form of a connector pin.

20 Claims, 11 Drawing Figures

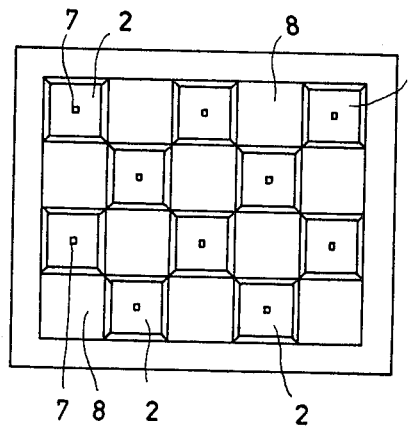
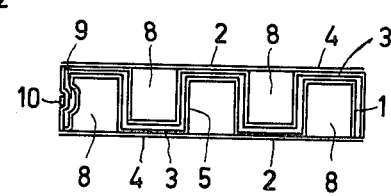
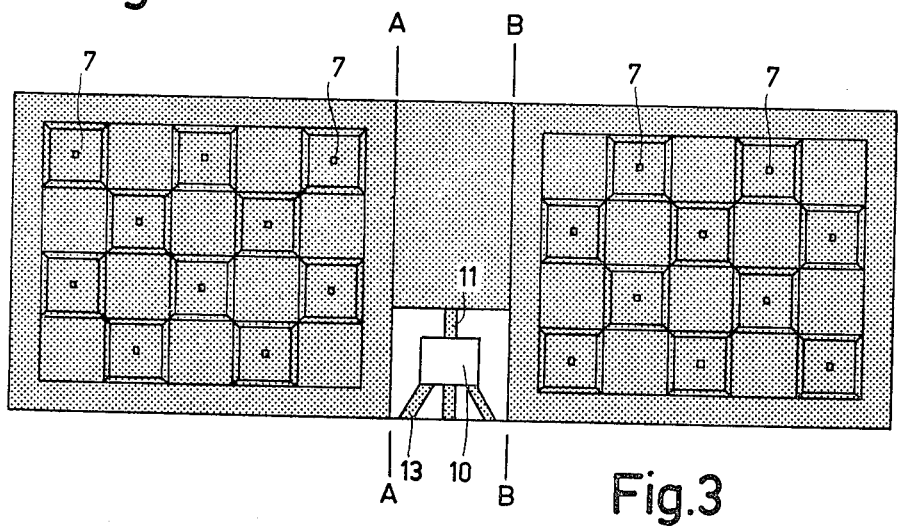
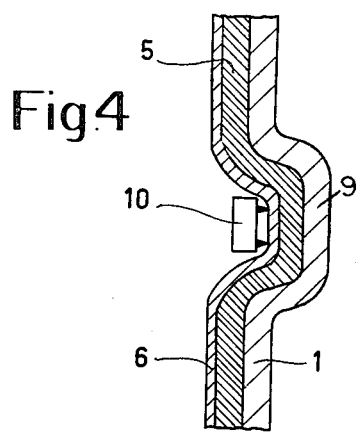
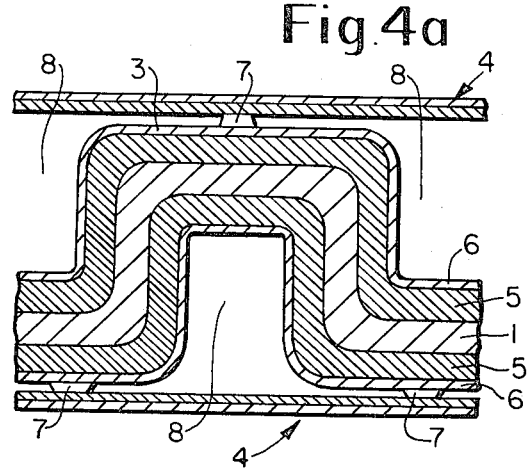

ACOUSTIC ELECTRICAL CONVERSION DEVICE WITH AT LEAST ONE CAPACITOR ELECTRET ELEMENT CONNECTED TO AN ELECTRONIC CIRCUIT

The invention relates to a device for the conversion of acoustic vibrations into electrical oscillations and vice versa, provided with at least one capacitor electret element connected to an electric circuit which comprises an impedance transformer, the electret element being provided with at least one foil of a dielectric polymer material with at least one electrode arranged thereon.

Such a device is known from U.S. Pat. No. 3,300,585. This patent describes an electret microphone having a diaphragm made of an electret foil of polymer material positioned against a perforated flat back electrode. Inside the housing a mounting plate is secured to the rear of the microphone. This plate accommodates an electric circuit in the form of an impedance transformer followed by a simple microphone amplifier.

It has been found that such a device can be manufactured in a very small and compact form, especially if the electric circuit is an integrated circuit.

However, a drawback of this device is that the electrical connections to the electret microphone element are cumbersome and generally laborious because soldered joints have to be used.

It is an object of the invention to mitigate this drawback and the invention is characterized in that a part of the foil extends beyond the electret element. The electric circuit, in the form of an integrated semiconductor device, is disposed on said part of the foil and the electrode is electrically connected to one of the terminals of the semiconductor device via a conductor which is disposed on the foil.

An integrated semiconductor device is generally mounted on a base or substrate, for example a ceramic plate or a foil of dielectric polymer material sold under the trade name Kapton. The connections of this device (bonding) are in direct contact with printed wiring which has been provided on the base especially for this purpose. Using said foil as the base has the advantage that this foil can be employed directly either as a diaphragm or as a base for the back electrode.

In the mass production of, for example, electret diaphragms a very thin metal layer of approximately 0.2 μm thickness is deposited on the electret foil as an electrode. During manufacture the integrated semiconductor device should then be mounted on this foil, while it is obvious that there should be provided a special printed circuit pattern which includes the said electrode.

In an embodiment in accordance with the invention said foil is arranged on a support body and said electrode, i.e. at least a flat part thereof, constitutes the back electrode of the electret element, said electrode being disposed on the diaphragm side of the foil. The back electrode may be honeycomb-shaped, i.e. the base then consists of a plate with a honeycomb-profile, on which the foil fits tightly. The back electrode then in fact consists of a plurality of flat portions.

In both embodiments each flat portion is provided with projections of an insulating thixotropic paint applied by silk-screening. The diaphragm which cooperates with said back electrode is positioned against said projections. The use of this silk screening process enables a very high degree of accuracy to be obtained in mass production.

In the first embodiment the metal layer is divided into a plurality of separate surface portions, one centrally disposed flat portion serving as back electrode and a peripheral portion serving for the electrical connection to the diaphragm. The central and peripheral portions are both connected to the semiconductor device via conductors arranged on the foil.

Such a back electrode is provided with a plurality of perforations between the projections so as to promote the acoustic action of the device in accordance with the invention.

If the foil which is then used consists of an electret material, the sequence of foil and the back electrode arranged on said foil should be reversed, so that the foil is disposed between the diaphragm and the back electrode. The diaphragm may then consist of a single metal plate, for example aluminium. Alternatively, the diaphragm may then comprise a polymer foil of a non-electret material on which a very thin metal electrode is disposed.

If the foil, when used as a base for the back electrode, is made of a non-electret material, the diaphragm should obviously consist of an electret foil with a very thin metal electrode on it.

When a plurality of devices in accordance with the invention are used, they can all be connected to one integrated semiconductor device by series or parallel connection of the electret elements. Said semiconductor device is then arranged more or less centrally and is surrounded by parts of the foil, each part performing either the function of a diaphragm or the function of a base for the back electrode.

By thus arranging two devices in accordance with the invention an excellently performing rumble-free microphone combination can be obtained, which is particularly suitable for incorporation into an apparatus for reproducing and/or recording sound waves, as for example a magnetic tape apparatus.

Such a microphone combination is characterized in that the electret elements are arranged as capacitor microphones parallel to each other in a mirror-inverted configuration and are acoustically isolated by a partition, both the diaphragms and the back electrodes being electrically interconnected and constituting connections with the integrated semiconductor device via conductors arranged on the foil. The foil is folded around the partition and the semiconductor device is disposed at the location of the side wall of the partition.

The partition may consist of the previously described honeycomb-shaped base.

A preferred embodiment is characterized in that the partition takes the form of a connector pin, the microphone elements being disposed on the upper part of the connector pin and the foil extending partly over the lower part of the connector pin, while some surface portions are provided with a thin metal layer which function as connector contacts.

The afore-mentioned microphone combinations can be manufactured with very small dimensions, which is of particular importance for mounting in, for example, "behind-the-ear" hearing-aids.

The invention will be described in more detail with reference to the accompanying drawing.

This drawing comprises the following Figures.

Figure 6:
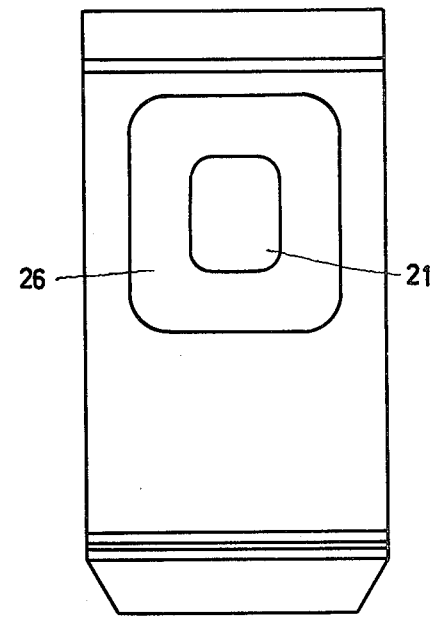
Figure 7:
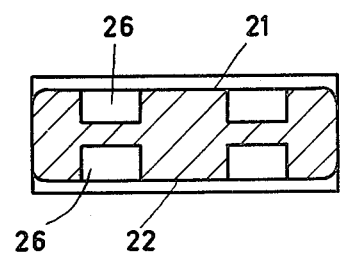
Figure 8:
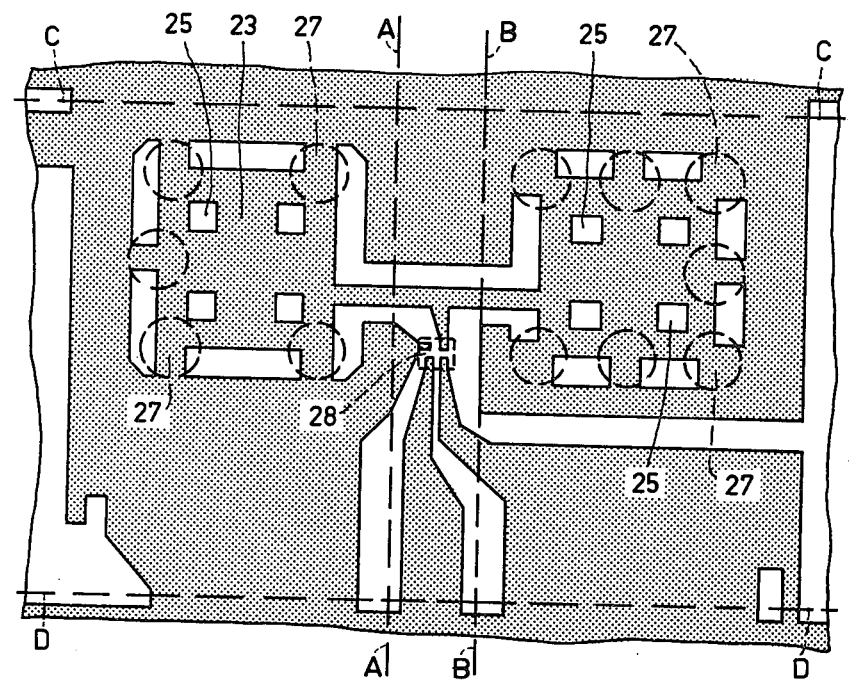
Figure 10:
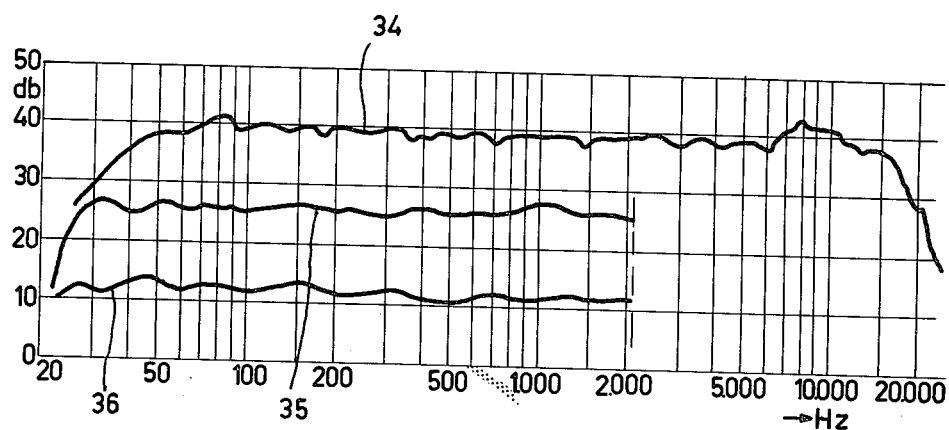
Figure 9:
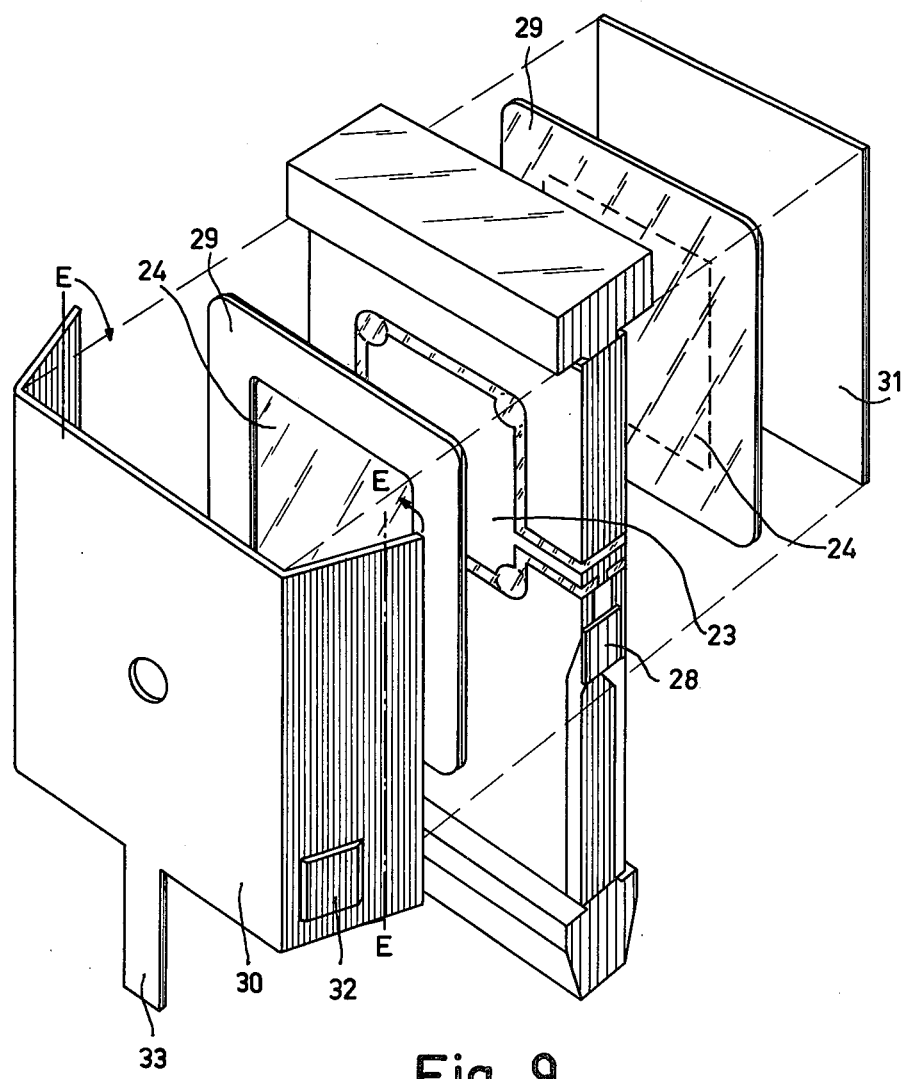

FIGS. 1-4 and 4a show a honeycomb-shaped device in accordance with the invention which serves as a rumble-free microphone combination, FIG. 1 being a plan view, FIG. 2 a cross-sectional view, FIG. 3 showing an unfolded foil back electrode, FIG. 4 showing a cross-sectional detail as to how the semiconductor device is mounted on the side wall, and FIG. 4a showing another cross-sectional detail of the microphone, FIGS. 5-10 relate to a rumble-free microphone combination in accordance with the invention and taking the form of a connector pin, FIGS. 5 and 6 show side views of the supporting body, FIG. 7 shows a cross-sectional view of the support body, FIG. 8 shows an unfolded foil with the back electrodes for two devices being arranged in the electrode layer, FIG. 9 shows an exploded view, and FIG. 10 shows some frequency response curves.

FIGS. 1 to 4 and 4a show a very small device in accordance with the invention, which is eminently suitable for incorporation in a hearing-aid and in particular a hearing-aid of the "behind-the-ear" type. Such a hearing aid is crescent-shaped and has very small dimensions. The transducers, i.e. microphone and receiver, used therein should consequently be of very small dimensions. The device in accordance with FIGS. 1 to 4 and 4a can be used both as a microphone and as a receiver. The maximum external dimension is then 5 mm.

On both sides of a support body 1, which consist of a honeycomb-shaped aluminium sheet, identical microphone (or receiver) elements 2 are mounted.

These two microphone elements are each constituted by a back electrode 3 and a diaphragm 4.

On one side of a KAPTON foil 5 of 100 μm thickness, there is provided an electrode layer 6 of 0.2 μm thickness. The support body 1 has been given a regular honeycomb pattern. The KAPTON foil 5 is tightly fitted on this honeycomb pattern. This is effected on both sides of the support body or substrate 1 in such a way that the electrode layer 6 is disposed on the outside. For the sake of clarity FIG. 4 shows the KAPTON foil 5 and the electrode layer 6 on only one side of the support body 1. Each microphone element 2 now constitutes ten flat portions with interposed recesses or volumes 8. The electrode layer 6 now forms the back electrode 3 on the flat portions.

The flat portions, which constitute the microphone elements 2, are each provided with one projection 7, which is centrally disposed and consists of an insulating thixotropic paint. Its dimensions are: cross-section 0.1 mm and height 25 μm.

Each diaphragm 4 rests against the respective back electrode 3 of microphone elements 2, i.e. in fact against the projections 7.

Each diaphragm consists of a foil made of an electret polymer material with a 0.2 μm metal electrode on the outside. The thickness of the electret foil is 20 μm.

Thus, two microphone elements 2 are formed with air volumes 8 interposed between the flat portions. The air volumes associated with each microphone element 2 are acoustically isolated from each other by the support body 1, which functions as a partition. For each microphone element 2 the diaphragm 4 and the associated air volumes cooperate with each other acoustically, said volumes serving to obtain the desired frequency response of the microphone element. The two microphone elements are now electrically interconnected in such a way that they are driven in phase for the desired sound vibrations and in phase opposition for undesired, generally mechanical vibrations and are thus insensitive to these mechanical vibrations.

FIG. 3 shows a development of the KAPTON foil 5 with the electrode layer 6 arranged thereon.

The KAPTON foil is provided with a thin electrode layer (shown shaded) in accordance with a certain pattern which substantially comprises 3 parts, namely two large substantially identical areas which serve as back electrodes and which are separated by a narrow central part between the axes A—A and B—B, which serves for mounting an integrated semiconductor device 10. The semiconductor device (integrated circuit) is connected to a number of printed conductors 13 and to a conductor 11 which provides the connection to both of the back electrodes via the central part of the thin metal layer 6.

The projections 7 in accordance with the honeycomb pattern are obtained by means of silk-screening.

The KAPTON foil thus treated is folded around the support body in accordance with the following axes A—A and B—B so that the central part forms a part of the foil extending beyond each electret microphone element.

In this way the kapton foil 5 extends over one side 9 of the support body 1 beyond the electret elements 2. On the side 9 of the support body 1 an integrated semiconductor device 10 is mounted on the KAPTON foil 5, see FIG. 4. As mentioned above, and contrary to the foregoing, FIG. 4 shows the kapton foil 5 and the electrode layer 6 on only one side of the support body 1. This construction is also possible. However, in that case one obtains only one microphone element 2 on one side (top or bottom) of the support body 1, but without compensation for mechanical vibration. The KAPTON foil in FIG. 3 then consists of that part to the left of the line B—B or to the right of the line A—A.

The semiconductor device, whose maximum dimension is 0.6 mm, comprises an impedance transformer, which reduces the impedance of the device so that it is suitable for connection to a microphone amplifier and, as the case may be, an amplifier element.

Another embodiment of the invention is shown in FIGS. 5-9. The device, which is a microphone in the form of a connector pin, is specially adapted for incorporation into playback equipment, such as magnetic-tape equipment.

The motors of the drive system in such equipment produce a lot of mechanical noise. Therefore, in order to provide rumble compensation, the present device, as well as the device in accordance with FIGS. 1 to 4, comprises two microphone elements located in a parallel mirror-image arrangement.

The device comprises a partition 20, which takes the form of a flat connector pin.

On the opposite flat side faces of pin 20 two electrostatic microphone elements 21 and 22 are arranged.

These microphone elements are disposed on the upper part of the connector pin. Each element comprises a back electrode 23 with a diaphragm 24.

Each back electrode 23 consists of a thin metal layer which is arranged on a KAPTON foil.

Each diaphragm 24 consists of a rectangular foil of an electret polymer material. On the outside it is provided with a thin metal electrode. At the periphery the diaphragm is glued onto a thin copper frame 29.

Each back electrode 23 is provided with four regularly arranged projections 25, which consist of an insulating thixotropic paint.

Each diaphragm 24 is positioned against these projections 25 on its respective back electrode. For the acoustic operation of each microphone element 21, 22 a rectangular cut-out 26 is formed in the partition 20 underneath each back electrode 23. Furthermore, the metal layer and the KAPTON foil are provided with perforations 27 at the periphery of each back electrode 23 so that the very thin air gap between each diaphragm 24 and the back electrode 23 communicates with the respective cut-out 26. The diaphragm thus acoustically cooperates with the air volume formed by the cut-out 26 enabling the frequency response of the microphone element to be determined depending on said volume. Moreover, the two back electrodes 23 are now electrically insulated (i.e. separated) from the rest of the thin metal layer on the KAPTON foil.

On the kapton foil an integrated semiconductor device 28 is mounted which is electrically connected to the electrically interconnected back electrodes 23 and which, via the peripheral portion of the metal layer on the foil and via the copper frame 29, is also connected to the electrodes of the electrically interconnection diaphragms 24 (see FIGS. 8 and 9). The two microphone elements 21 and 22 are now electrically interconnected in such a way that they are driven in phase for the desired sound waves and in phase opposition for undesired mechanical vibrations (noise) and are thus insensitive to these mechanical vibrations.

Assembly begins with a kapton foil, shown unfolded in FIG. 8, provided with a metal layer (shaded) in a special pattern of printed circuitry and electrodes. The part of the metal layer forming each back electrode 23 extends beyond the area of the back electrode onto a common part of the foil between the axes A—A and B—B to provide an electrical connection of the back electrodes to integrated circuit 28. The KAPTON foil is cut along the lines C—C and D—D. The total width of the KAPTON foil then virtually corresponds to the length of the partition 20, which takes the form of a connector pin.

Prior to this the perforations 27 are formed to complete the separation between the central portion of the metal layer forming the back electrode 23 and the peripherally disposed metal layer. The projections 25 are formed by silk-screening.

The axes A—A and B—B are folding lines along which the KAPTON foil is folded around the partition 20 and is subsequently cemented thereto as shown in FIG. 9 in which, in contrast to FIG. 8, the ring shaped area of foil separating the back electrode metal layer 23 from the surrounding peripheral metal layer is shown shaded.

After fitting the diaphragm 24 a copper clamping bracket comprising the portions 30 and 31 is fitted around the microphone elements, the portion 30 being folded around portion 31 in accordance with two folding lines E—E.

This clamping bracket is provided with a recess 32 which accommodates the semiconductor device 28. Furthermore, the clamping bracket 30, 31 is provided with a contact lug 33, which is positioned against one of the peripheral metal layers on the KAPTON foil, so that this metal layer is electrically connected via the copper frames 29 to the electrodes of the diaphragms 24.

FIG. 10 shows some frequency response curves of this rumble-compensated microphone combination.

In these curves the ordinate represents the sensitivity in dB and the abscissa the frequency in Hz.

Curve 34 is the frequency response curve of the microphone combination which has a substantially flat shape from 50 to 15,000 Hz.

The curves 35 and 36 represent so-called rumble characteristics. The curve 35 refers to a single microphone element, i.e. non-compensated, whereas the curve 36 refers to the rumble-free microphone combination, i.e. comprising two microphone elements. These curves show that an average reduction of approximately 8 dB is obtained. The measurements for the rumble characteristics 35 and 36 were carried out up to 2000 Hz.

Some typical dimensions are: length of connector pin 10 mm, thickness 1.5 mm, length of KAPTON foil 8.3 mm, diameter of diaphragm 5.1 mm. Thickness of KAPTON foil 300 μm and thickness of diaphragm 12 μm.

What is claimed is:

1. A device for the conversion of acoustic vibrations into electrical oscillations and vice versa, comprising at least one capacitor electret element provided with at least one foil of a dielectric polymer material with at least one electrode in the form of a metal layer arranged thereon, a diaphragm with a second electrode disposed thereon, said one foil comprising one surface part lying inside the electret element and a second surface part of the foil extending beyond the electret element, and an integrated semiconductor device disposed on said second surface part of the foil and with the metal layer being electrically connected to one terminal of the semiconductor device via a conductor which is disposed mainly on the second surface part of said one foil.

2. A device as claimed in claim 1 wherein the foil comprises an electret material.

3. A device as claimed in claim 1, characterized in that said foil is arranged on a support body and said one electrode includes a flat part that constitutes a back electrode of the electret element, said one electrode being disposed on the diaphragm side of the foil.

4. A device as claimed in claim 3, wherein the support body comprises a plate with a honeycomb profile on which the foil fits tightly.

5. A device as claimed in claim 4 wherein the metal layer includes a plurality of flat portions covering said one surface part of said foil and further comprising one or more projections of an insulating thixotropic paint formed on said flat portions by silk-screening, the diaphragm being positioned against the projections.

6. A device as claimed in claim 3, wherein the metal layer is divided into first and second separate surface portions comprising one centrally disposed flat portion covering said one surface part of said one foil and serving as the back electrode and a second peripheral portion covering the second surface part of said one foil to provide an electrical connection to said second electrode disposed on the diaphragm, which central and peripheral portions are each connected to the semiconductor device via separate conductors arranged on the foil.

7. A rumble-free microphone combination comprising first and second devices as claimed in any of the claims 3 to 5 to provide first and second capacitor electret elements, wherein the first and second capacitor electret elements are arranged parallel to each other in a mirror-inverted configuration and are acoustically isolated by the support body functioning as a partition, said one electrode and said second electrode of the first and second electret elements being electrically interconnected so as to cancel undesired noise, and wherein a single foil is common to the first and second electret elements and is folded around the partition and the semiconductor device is disposed on the side wall of the partition.

8. A rumble-free microphone combination as claimed in claim 7, wherein the support body comprises a honeycomb-shaped profiled metal sheet against which the foil is tightly fitted.

9. A rumble-free microphone combination as claimed in claim 7, wherein the support body takes the form of a connector pin, the electret elements being disposed on the upper part of the connector pin and the single foil extending partly over the lower part of the connector pin, some surface portions being provided with a thin metal layer which function as connector contacts.

10. A device as claimed in claim 1 wherein the integrated semiconductor device includes an impedance transformation device.

11. A device as claimed in claim 1 wherein said foil of dielectric polymer material is electrically charged or polarized so as to form an electret.

12. A device as claimed in claim 7 wherein the integrated semiconductor device includes an impedance transformation device.

13. An electro-acoustic conversion device comprising, a thin support body having first and second flat surfaces on opposite sides thereof and a thin side wall, a foil composed of a dielectric polymer material having a metal layer disposed on one surface thereof to form a first electrode, said foil being folded around the support body to cover at least a part of said first and second surfaces and said side wall and with the metal layer on the outside, first and second diaphragms each having a second electrode disposed thereon and closely confronting said first and second support body surfaces, respectively, to form first and second capacitor electret elements acoustically isolated by the support body functioning as a partition, and a semiconductor integrated circuit disposed on said side wall and having one terminal electrically connected to said metal layer which provides an electric connection to said first electrode, the first and second electrodes of the first electret element being electrically connected to the first and second electrodes of the second electret element, respectively.

14. A device as claimed in claim 13 wherein the support body comprises a metal plate with a honeycomb-shaped profile against which the foil is tightly fitted so as to form a plurality of flat parts with recesses interposed therebetween on each of said first and second surfaces and with the metal layer on said flat parts being electrically connected to form a back electrode of each electret element.

15. A device as claimed in claim 14 wherein one or more insulating projections extend from said flat parts and said first and second diaphragms are positioned against said projections on said first and second surfaces, respectively, so as to be spaced apart from said metal layer on the dielectric foil.

16. A device as claimed in claims 13 or 14 wherein the dielectric foil further comprises a separate metal layer peripherally disposed on said one surface of the foil and extending at least partly over the side wall of the support body to provide a further electrical connection to a further terminal on said semiconductor integrated circuit.

17. A device as claimed in claim 13 wherein the support body is shaped as a connector pin with the electret elements disposed on the upper part of the connector pin and the dielectric foil extends partly over the lower part of said pin and with thin metal layer portions on said foil which function as connector contacts.

18. An electro-acoustic conversion device that includes at least one capacitor electret element provided with a diaphragm having a first electrode disposed thereon and a second electrode functioning as a back electrode, the improvement in the electret element comprising, at least one foil made of a dielectric polymer material with a metal layer arranged thereon to form one of said first or second electrodes, said one foil comprising one surface part lying inside the electret element and a second surface part of the foil extending beyond the electret element, and an integrated semiconductor device disposed on said second surface part of the foil and with the metal layer being electrically connected to one terminal of the semiconductor device via a conductor which is disposed mainly on the second surface part of said one foil.

19. A device as claimed in claim 18 wherein said one surface part of the foil functions as said diaphragm of the electret element.

20. A device as claimed in claim 18 wherein said foil is arranged on a flat support body having a honeycomb-shaped profile, and wherein said diaphragm comprises a thin flat member made of a polymer material and with a second metal layer disposed thereon to form the other one of said first or second electrodes, said diaphragm being arranged in confronting spaced apart relationship to said dielectric polymer foil and with the first metal layer on the outside surface of the foil and adjacent the diaphragm and the second metal layer on the outside surface of the diaphragm so that the polymer diaphragm is sandwiched between the first and second metal layers.

* * * * *

UNITED STATES PATENT AND TRADEMARK OFFICE
CERTIFICATE OF CORRECTION

PATENT NO.  : 4,286,122
DATED       : August 25, 1981
INVENTOR(S) : WILHELMUS H. IDING It is certified that error appears in the above-identified patent and that said Letters Patent is hereby corrected as shown below:

Column 6, line 67, claim 7, "3 to 5" should be --3 to 6--.

Signed and Sealed this

Fifteenth Day of November 1983

[SEAL]

Attest:

GERALD J. MOSSINGHOFF

Attesting Officer

Commissioner of Patents and Trademarks